United States Patent
Chang et al.

(10) Patent No.: US 6,696,717 B2
(45) Date of Patent: Feb. 24, 2004

(54) MEMORY CELL WITH VERTICAL TRANSISTOR AND TRENCH CAPACITOR

(75) Inventors: Ming Cheng Chang, Taoyuan Hsien (TW); Jeng-Ping Lin, Taoyuan Hsien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/299,431

(22) Filed: Nov. 18, 2002

(65) Prior Publication Data

US 2004/0007728 A1 Jan. 15, 2004

(30) Foreign Application Priority Data

Jul. 9, 2002 (TW) .................................. 91115156 A

(51) Int. Cl.[7] .............................................. H01L 29/72
(52) U.S. Cl. ...................... 257/301; 257/302; 257/304; 257/306; 257/328
(58) Field of Search ................................. 257/301, 302, 257/304, 306, 328

(56) References Cited

U.S. PATENT DOCUMENTS

| 6,566,177 B1 | * | 5/2003 | Radens et al. | ............... 257/301 |
| 2002/0085434 A1 | * | 7/2002 | Mandelman et al. | ....... 257/301 |

* cited by examiner

Primary Examiner—Edward Wojciechowicz
(74) Attorney, Agent, or Firm—Merchant & Gould P.C.

(57) ABSTRACT

A memory cell with a vertical transistor and a trench capacitor. The memory cell includes a substrate having a trench and a trench capacitor disposed in the lower trench. A control gate, with a p-type polysilicon germanium layer and an overlying p-type polysilicon layer, is disposed in the upper trench and insulated from the substrate. A first insulating layer is disposed between the trench capacitor and the control gate. A first doped region is formed in the substrate around the first insulating layer and a second doped region is formed in the substrate around the second conductive layer.

17 Claims, 2 Drawing Sheets

US 6,696,717 B2

MEMORY CELL WITH VERTICAL TRANSISTOR AND TRENCH CAPACITOR

BACKGROUND OF THE INVENTION

1. Field of the Invention

The present invention relates in general to a semiconductor device. More particularly, it relates to a memory cell with a vertical transistor and a trench capacitor that enhances electrical properties and increases integration with integrated circuits (ICs).

2. Description of the Related Art

With the wide application of integrated circuits (ICs), several kinds of semiconductor devices with higher efficiency and lower cost are produced based on different objectives. The dynamic random access memory (DRAM) is such an important semiconductor device in the information and electronics industry. Basically, a DRAM is an integrated circuit that stores data in binary form (e.g., "1" or "0") in a large number of cells.

Most DRAMs have one transistor and one capacitor in one DRAM cell. The memory capacity of the DRAM has reached 256 megabits. Therefore, under increasing integration it is required to shrink the size of the memory cell and the transistor so as to manufacture the DRAM with higher memory capacity and higher processing speed. A 3-D capacitor structure can itself reduce occupied area in the semiconductor substrate, so the 3-D capacitor, such as a deep trench capacitor, is applied to the fabrication of the DRAM of 64 megabits and above. Traditional DRAM with a plane transistor covers larger areas of the semiconductor substrate and cannot satisfy the demand of high integration. Therefore, a vertical transistor which can save space is a trend in fabrication of a memory cell.

There is much interest in reducing the size of individual semiconductor devices to increase their density on an IC chip. This reduces size and power consumption of the chip, and allows faster operation. In order to achieve a memory cell with minimum size, the gate length (line width) in a conventional plane transistor must be reduced to decrease the lateral dimension of the memory cell. However, punch through, drain-induced barrier lowering (DIBL), and threshold voltage roll-off occur when the line width is shrink, as known to those of ordinary skill in the art. In order to solve those problems, heavy doping areas are formed in the substrate between drain and source of the plane transistor by halo implantation, thereby preventing punch trough and DIBL and raising the threshold voltage. Unfortunately, in a vertical transistor structure, it is difficult to perform halo implantation. Since the vertical transistor is a trend in fabrication of a memory cell, another way to prevent punch through, DIBL, and threshold voltage roll-off is needed.

SUMMARY OF THE INVENTION

Accordingly, an object of the invention is to provide a novel memory cell with a vertical transistor and a trench capacitor, in which the gate material of the vertical transistor is composed of two kinds of materials having different work function, thereby changing its channel property from halo implantation for conventional plane transistor.

According to one aspect, the invention provides a memory cell with a vertical transistor and a trench capacitor. The memory cell includes a substrate, a trench capacitor, a control gate, a first insulating layer, a first doped region, and a second doped region. The substrate has a trench. In the lower trench, there is a trench capacitor disposed, which has a bottom electrode formed in the substrate around the low trench. The control gate, which has a first conductive layer and an overlying second conductive layer, is disposed in the upper trench and insulated from the substrate. The first insulating layer is disposed between trench capacitor and the control gate. The first doped region is formed in the substrate around the first insulating layer and the second doped region is formed in the substrate around the second conductive layer.

Moreover, the memory cell further includes a third conductive layer, which is disposed between the first insulating layer and the trench capacitor, and an interfacial layer, which is disposed between the third conductive layer and the first doped region. The first conductive layer is p-type polysilicon germanium and the second conductive layer is p-type polysilicon.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE INVENTION

FIGS. 1–4 are cross-sections showing a method of fabricating a DRAM with a vertical transistor and a trench capacitor according to the present invention.

Figure 1:
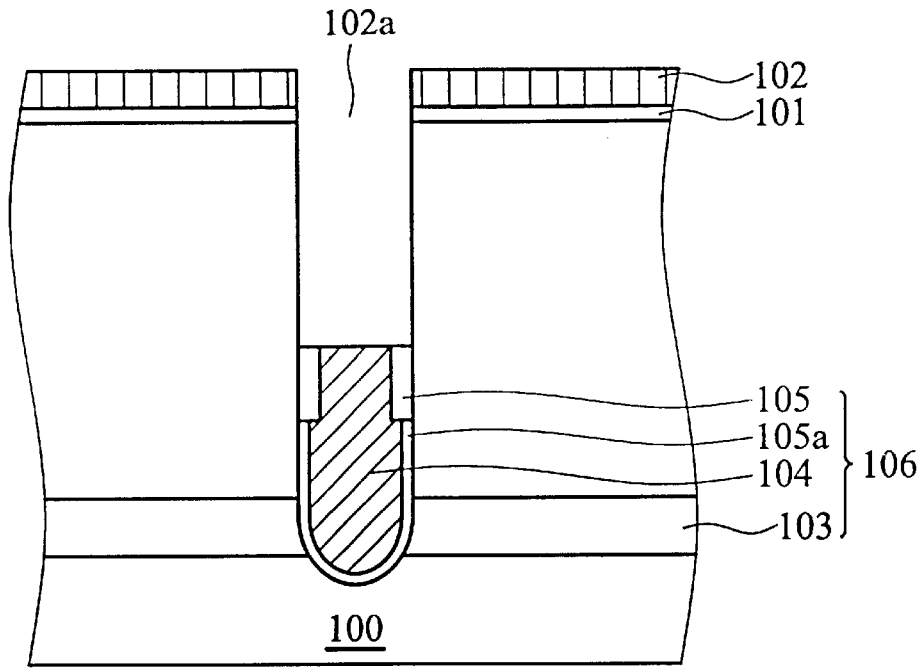
FIGS. 1–4 are cross-sections showing a method for fabricating a memory cell with a vertical transistor and a trench capacitor according to the present invention.

First, in FIG. 1, a substrate 100, such as a silicon wafer, is provided. A pad oxide 101 and a silicon nitride layer 102 are formed on the substrate 100. In this invention, the pad oxide layer 101 has a thickness of about 100 Å and can be formed by thermal oxidation or conventional CVD, such as atmospheric pressure CVD (APCVD) or low pressure CVD (LPCVD). The silicon nitride layer 102 overlying the pad oxide layer 101 has a thickness of about 1000~2000 Å and can be formed by LPCVD using $SiCl_2H_2$ and $NH_3$ as reaction source.

A photoresist layer (not shown) is coated on the silicon nitride layer 102. Thereafter, lithography is performed on the photoresist layer to form openings inside. The photoresist layer having the openings is used as a mask to anisotropically etch the layers 102, 101, for example, reactive ion etching (RIE), to transfer the pattern of the photoresist layer to the layers 102, 101 and form a plurality of openings inside to expose the substrate 100. Anisotropic etching, such as RIE, is performed on the substrate 100 using the silicon nitride 102 as a hard mask to form a plurality of trenches. In order to simplify this diagram, only one trench 102a is shown.

Next, a trench capacitor 106 is formed in the lower trench 102a by conventional approach. The trench capacitor 106 includes a collar insulator 105, an upper electrode 104, a capacitor dielectric 105a, and a bottom electrode, 103. The collar insulator 105 can be silicon oxide, and the upper electrode 104 can be polysilicon. The bottom electrode is formed in the substrate 100 around lower trench 102a.

Figure 2:
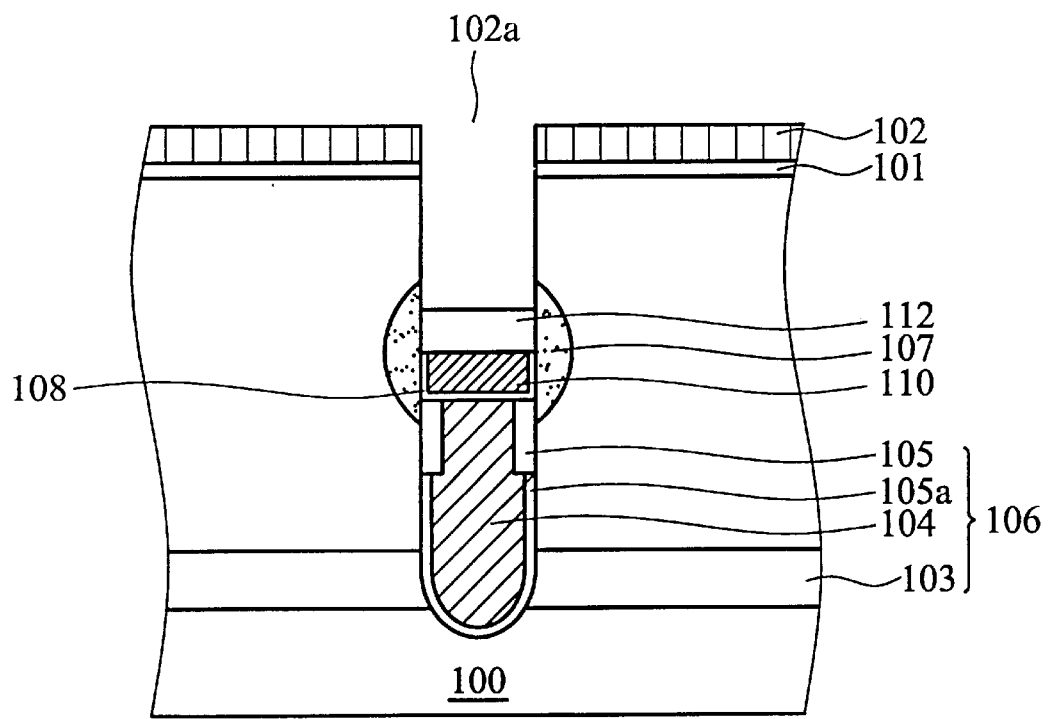

Next, in FIG. 2, a doped silicate glass (not shown), such as arsenic silicate glass (ASG), is formed on the sidewall of the trench 102a over the trench capacitor 106. Next, a first doped region 107 is formed in the substrate 100 by thermal diffusion to serve as the drain region of a transistor (not shown). After the doped silicate. glass is removed, an interfacial layer 108, such as a thin silicon nitride layer, is formed on the sidewall and the bottom of the deep trench 102a having a trench capacitor 106 therein to serve as an insulator between the first doped region 107 and the trench capacitor 106. The interfacial layer 108 has a thickness of 5~10 Å and the height of its sidewall portion is below first doped region 107.

A third conductive layer 110, such as polysilicon, is formed in the deep trench 102a having the interfacial layer 108 therein. The height of the third conductive layer 110 is substantially equal to that of the interfacial layer 108 to serve as an electric connection between the first doped region 107 and the trench capacitor 106 during the memory cell is operated.

A conformable first insulating layer 112, such as silicon oxide, is deposited on the silicon nitride layer 102 and the surface of the deep trench 102a by CVD. Subsequently, the first insulating layer 112 formed on the silicon nitride layer 102 and the sidewall of the deep trench 102a is removed to leave the first insulating layer 112 on the third conductive layer 110. The remaining first insulating layer 112 is surrounded by the first doped region 107 and serves as an insulator between the trench capacitor 106 and the transistor (not shown).

Figure 3:
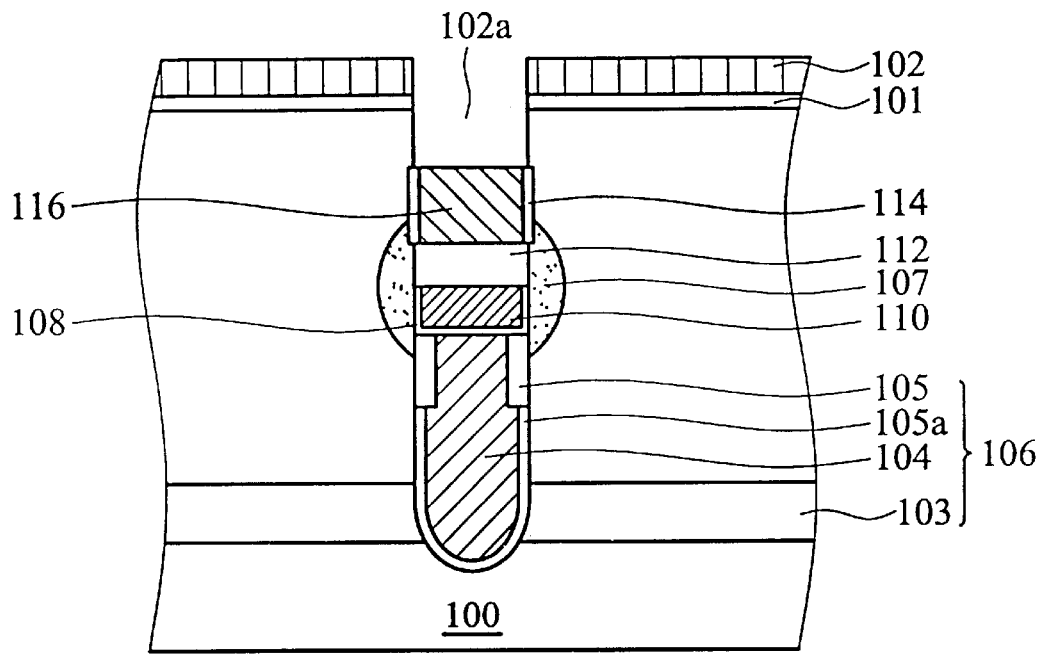

Next, in FIG. 3, a conformable gate oxide layer 114 is formed on the sidewall of the upper trench 102a by thermal oxidation or other deposition. Thereafter, a first conductive layer 116, such as polysilicon germanium, is formed on the first insulating layer 112 by gas source molecular beam epitaxy (GSMBE) or ultra high vacuum CVD (UHVCVD). Moreover, boron ions can be in-situ doped into the first conductive layer 116 to form a p-type polysilicon germanium layer. In this invention, the height of the first conductive layer 116 is substantially equal to that of the gate oxide layer 114 and below the top surface of the substrate 100. In addition, the first conductive layer 116 is insulated from the substrate 100 by the gate oxide layer 114.

Figure 4:
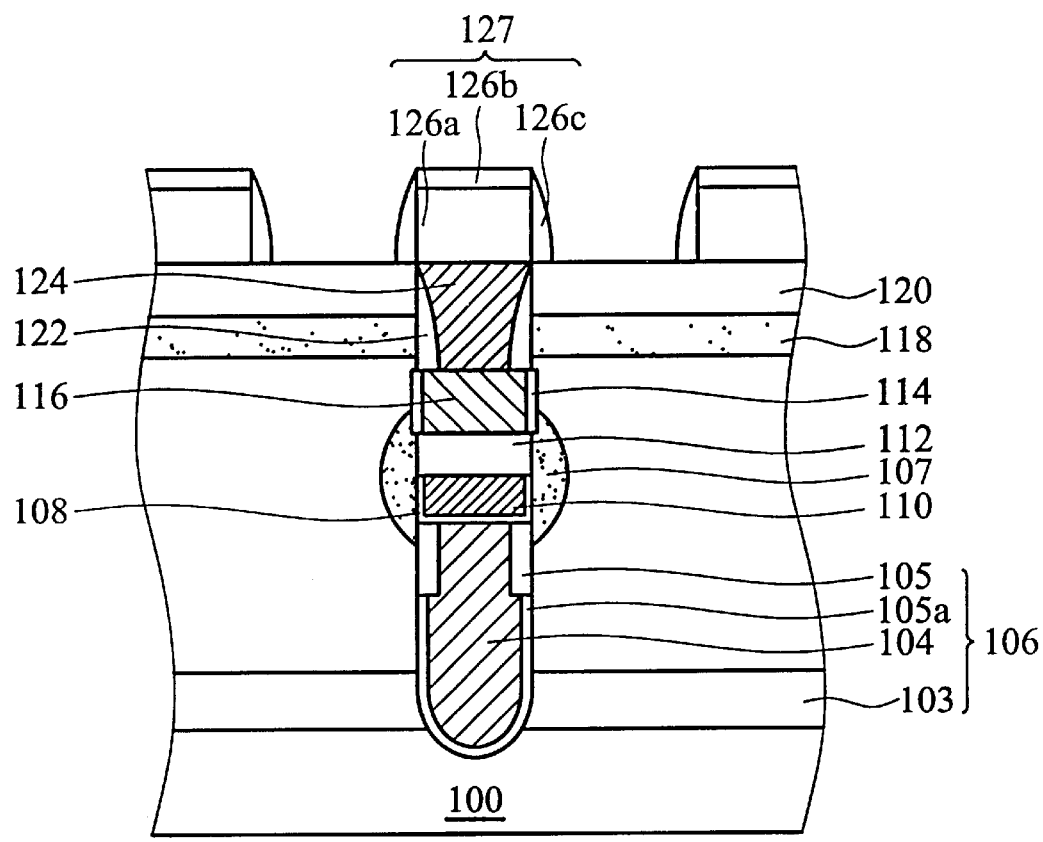

Finally, in FIG. 4, a second conductive layer 124 and an insulating spacer 122 are formed on the first conductive layer 116. The second conductive layer 124 can be p-type polysilicon and the insulating spacer 122 can be silicon nitride. Thereafter, ion implantation is performed on form a second doped region 118 in the substrate 100 around the second conductive layer 124 after the silicon nitride layer 101 is removed. The second doped region 118 serves as the source region of a transistor. In this invention, the first and second conductive layers 116, 124 are used as a control gate of the memory cell. Moreover, the control gate and the doped regions 107, 108 creates a vertical transistor. The insulating spacer 122 is used as an insulator between the second conductive layer 124 and the second doped region 118.

Next, a second insulating layer 120, such as silicon oxide, is formed over the second doped region 118 by conventional deposition. The height of the second insulating layer 120 is substantially equal to that of the second conductive layer 124 and the insulating spacer 122. A plurality of gate structures 127 is then formed on the second conductive layer 124 and the second insulating layer 120. The gate structure 127 formed on the second conductive layer 124 serves as a word line. Each gate structure 127 includes a gate 126a, a gate spacer 126c, and a cap layer 126b. Moreover, the gate spacer 126c and the cap layer 126b can be silicon nitride.

Compared with the prior art, the memory cell according to the invention can effectively shrink its lateral dimension due to its transistor having a vertical channel, thereby increasing the integration with ICs. Moreover, since the control gate of memory cell of the invention is composed of two kinds of materials (i.e., p-type polysilicon germanium and polysilicon), the channel property can be changed through both work function differences to prevent punch through, DIBL, and threshold voltage roll-off and increase drain current to raise processing speed. That is, it does not require ion implantation, such as halo implantation, to form heavy doped region, thereby simplifying process steps and reducing fabrication time.

The foregoing description has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A memory cell with a vertical transistor, comprising:
   a substrate having a trench;
   a trench capacitor disposed in the lower trench and having a bottom electrode formed in the substrate around the lower trench;
   a control gate disposed in the upper trench and insulated from the substrate and having a first conductive layer and an overlying second conductive layer, wherein the first and second conductive layers have different work functions;
   a first insulating layer disposed between the trench capacitor and the control gate;
   a first doped region formed in the substrate around the first insulating layer to serve as a drain region and electrically connected to the trench capacitor; and
   a second doped region formed in the substrate around the second conductive layer to serve as a source region.

2. The memory cell as claimed in claim 1, further comprising:
   a third conductive layer disposed between the first insulating layer and the trench capacitor; and
   an interfacial layer disposed between the third conductive layer and the first doped region.

3. The memory cell as claimed in claim 2, wherein the third conductive layer is polysilicon.

4. The memory cell as claimed in claim 2, wherein the interfacial layer is silicon nitride.

5. The memory cell as claimed in claim 2, wherein the interfacial layer has a thickness of about 5~10 Å.

6. The memory cell as claimed in claim 1, further comprising:
   a second insulating layer disposed over the second doped region; and
   a gate structure disposed over the control gate to serve as a word line and having a gate, a gate spacer, and a cap layer.

7. The memory cell as claimed in claim 6, wherein the second insulating layer is silicon oxide.

8. The memory cell as claimed in claim 6, wherein the gate spacer and the cap layer are silicon nitride.

9. The memory cell as claimed in claim 1, wherein the first conductive layer is p-type polysilicon germanium.

10. The memory cell as claimed in claim 1, wherein the second conductive layer is p-type polysilicon.

11. A memory cell with a vertical transistor, comprising:

a substrate having a trench;

a trench capacitor disposed in the lower trench and having a bottom electrode formed in the substrate around the lower trench;

a control gate disposed in the upper trench and insulated from the substrate and having a p-type polysilicon germanium layer and an overlying p-type polysilicon layer;

a first insulating layer disposed between the trench capacitor and the control gate;

a conductive layer disposed between the first insulating layer and the trench capacitor;

a first doped region formed in the substrate around the first insulating layer to serve as a drain region and electrically connected to the trench capacitor;

an interfacial layer disposed between the conductive layer and the first doped region; and a second doped region formed in the substrate around the second conductive layer to serve as a source region.

12. The memory cell as claimed in claim 11, further comprising:

a second insulating layer disposed over the second doped region; and a gate structure disposed over the control gate to serve as a word line and having a gate, a gate spacer, and a cap layer.

13. The memory cell as claimed in claim 12, wherein the second insulating layer is silicon oxide.

14. The memory cell as claimed in claim 12, wherein the gate spacer and the cap layer are silicon nitride.

15. The memory cell as claimed in claim 11, wherein the conductive layer is polysilicon.

16. The memory cell as claimed in claim 11, wherein the interfacial layer is silicon nitride.

17. The memory cell as claimed in claim 11, wherein the interfacial layer has a thickness of about 5~10 Å.

* * * * *